United States Patent [19]

Wrathall

[11] 4,319,181
[45] Mar. 9, 1982

[54] SOLID STATE CURRENT SENSING CIRCUIT
[75] Inventor: Robert S. Wrathall, Tempe, Ariz.
[73] Assignee: Motorola, Inc., Schaumburg, Ill.
[21] Appl. No.: 219,795
[22] Filed: Dec. 24, 1980
[51] Int. Cl.$^3$ .......................... G05F 1/46; H03K 5/08
[52] U.S. Cl. .................................... 323/315; 323/277;
307/297; 307/299 B; 307/564; 330/257
[58] Field of Search ................................ 323/315–317,
323/276–278, 908; 307/296 R, 296 A, 297, 299
B, 564, 567, 568; 357/41–44; 361/5, 18;
330/253, 257, 277, 284, 288, 296, 297, 298, 299

[56]  References Cited
U.S. PATENT DOCUMENTS

| | | | |
|---|---|---|---|
| 3,783,400 | 1/1974 | Gay | 307/299 B |
| 3,996,498 | 12/1976 | Schade, Jr. | 323/315 X |
| 4,023,111 | 5/1977 | Mortensen | 307/564 X |
| 4,147,944 | 4/1979 | Monticelli | 307/297 X |
| 4,216,436 | 8/1980 | Lefferts | 307/299 B |
| 4,249,123 | 2/1981 | Kwan | 323/314 |

Primary Examiner—William M. Shoop
Assistant Examiner—Peter S. Wong
Attorney, Agent, or Firm—Joe E. Barbee

[57]  ABSTRACT

A solid state current sensing circuit which is useful in a power supply has bipolar as well as CMOS transistors. The bipolar transistors serve as output transistors and have lateral collectors as well as substrate collectors. The lateral collectors of the bipolar transistors are used to sense a portion of the current carried by the substrate collectors. The lateral collectors are connected to a current mirror which provides an output indication of when the output current exceeds a predetermined amount. The entire circuit can be integrated on a single chip.

9 Claims, 3 Drawing Figures

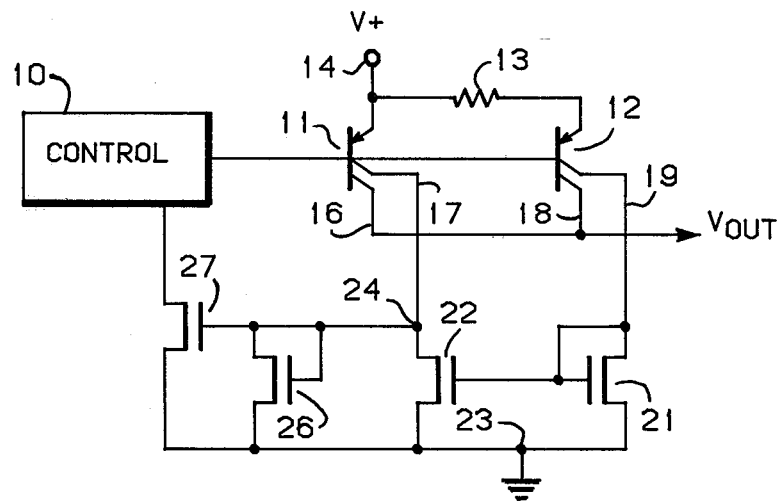
FIG 1
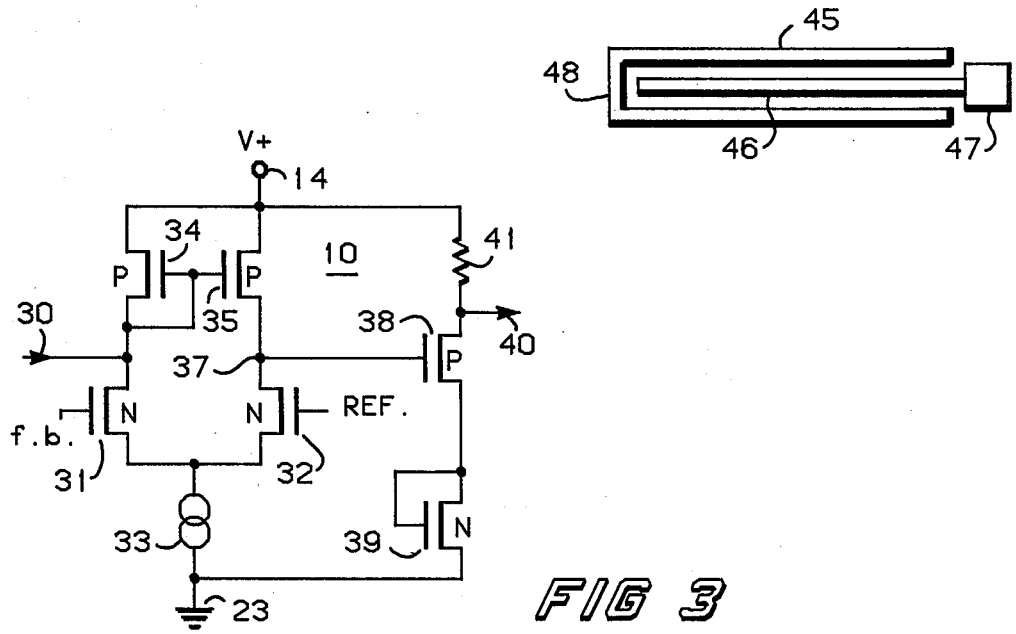
FIG 2
FIG 3

SOLID STATE CURRENT SENSING CIRCUIT

This invention relates, in general, to current sensing circuits, and more particularly, to a solid state current sensing circuit.

It is often desirable to sense current flowing in a circuit for various reasons. One such reason may be to monitor the sensed current to prevent current from exceeding a certain limit. This would be especially true in power supply circuits wherein it is desired to limit the output current from the power supply. Limiting the output current of the power supply can prevent damage to circuitry being powered by the power supply.

In the past, at least one of the techniques used to sense output current was to insert a resistor in series with the output line of a power supply, for example, and then to measure the voltage drop developed across the known resistor. The disadvantage of this type of an arrangement is that as the current flow through the resistor increases the output voltage decreases because of the voltage being dropped across the resistor.

Accordingly, it is an object of the present invention to provide a solid state current sensing circuit which does not cause a varying voltage drop.

Another object of the present invention is to provide an improved current sensing circuit which is independent of temperature.

A further object of the present invention is to provide a solid state current sensing and limit circuit which is substantially free from process variations.

Yet another object of the present invention is to provide a solid state current sensing circuit which can be implemented as a CMOS circuit to sense current supplied by bipolar transistors.

SUMMARY OF THE INVENTION

In carrying out the above and other objects of the invention in one form, there is provided a solid state current sensing circuit. The solid state current sensing circuit has a first and a second transistor each having integral means for sampling a portion of current being carried by the transistor. Means for creating an unbalance in the current carried by one of the transistors is coupled to the second transistor so that the sampled current from the second transistor will be less than the current sampled from the first transistor. A current mirror is coupled to the means for sampling and provides an indication of when the unbalance in current reaches a predetermined level. The output of the current mirror is used to controllably limit the current supplied by the first and second transistors.

BRIEF DESCRIPTION OF THE DRAWINGS

FIG. 1 illustrates a solid state current sensing circuit of the present invention;

FIG. 2 is a plan view of a lateral collector such as used in the circuit shown in FIG. 1; and FIG. 3 illustrates in schematic form a simplified control circuit for the circuit of FIG. 1.

The exemplification set out herein illustrates a preferred embodiment of the invention, in one form thereof, and such exemplification is not to be considered as limiting in any manner.

DETAILED DESCRIPTION OF THE DRAWINGS

The schematic of FIG. 1 shows field effect transistors as well as PNP transistors which can all be integrated on the same silicon chip. PNP transistors 11 and 12 are used to provide an output voltage, $V_{out}$. Transistor 11 is illustrated as being a PNP transistor having its emitter coupled to a voltage terminal 14 and having its base electrode connected to a control circuit 10. Transistor 11 is shown as having two collectors 16 and 17. Collector 16 is shown as being the main current carrying collector which provides the output voltage whereas collector 17 is shown connected to a node 24. Collector 16 is a vertical collector whereas collector 17 is a long lateral collector and carries a fraction of the current carried by collector 16. In the preferred embodiment, where collector 17 is a long lateral collector, it would have its own emitter which would in turn be connected to the main emitter. The emitter for transistor 17 is therefore illustrated in the schematic as being a single emitter. The base of transistor 11 is also connected to the base of transistor 12.

Transistor 12 is illustrated as having its emitter coupled to voltage terminal 14 by a resistor 13. Transistor 12 has a collector 19 which is connected to an N-channel field effect transistor 21, and has a collector 18 which is illustrated as being connected to collector 16 and to output $V_{out}$. Collector 19 is identical to collector 17 in that it is a long lateral collector having an associated emitter which is electrically connected to an emitter for collector 18. The portion of transistor 12 having a collector 18 is a verticl transistor, also known as a substrate transistor. It should be noted that collectors 16 and 18 are, in the preferred embodiment, the substrate of the silicon chip containing the circuitry illustrated in FIG. 1.

N-channel transistor 21 has its gate electrode connected to its drain electrode, and has its source electrode connected to voltage terminal 23 which is illustrated as ground. The gate electrode of transistor 21 is also connected to the gate electrode of an N-channel transistor 22. Transistor 22 has its drain connected to node 24 and has its source connected to voltage terminal 23. Transistors 21 and 22 form a current mirror. In a preferred embodiment, transistor 22 is twice as large as transistor 21. Node 24 is connected to the gate and drain of an N-channel transistor 26. Transistor 26 has its source connected to voltage terminal 23. Node 24 is also connected to the gate electrode of an N-channel transistor 27. The drain of transistor 27 is connected to control circuit 10, and its source is connected to voltage terminal 23.

Control circuit 10 provides an output to the base electrodes of transistors 11 and 12. Control circuit 10 establishes a reference as well as serving as a current control to establish the output $V_{out}$. It will be noted that the circuitry illustrated in FIG. 1 can serve as a power supply, lamp driver, relay driver, or any other type of drive circuit. The control circuitry 10 establishes the output voltage, and as long as the load connected to the power supply draws a low amount of current then collectors 17 and 19 will also conduct a low amount of current. This low current will flow through transistors 22 and 21 respectively. As transistor 22 conducts low current levels the voltage at node 24 will be a low level and will not enable transistors 26 and 27. As current flow through transistors 11 and 12 increases it will be noted that transistor 11 will commence to conduct more current since resistor 13 will start to affect, to a greater extent, the current flow through transistor 12 thereby causing transistor 12 to conduct less current than transistor 11. Since collectors 17 and 19 are the same physical size, less current will flow through collector 19 than through collector 17 because transistor 12 is carrying the lesser current. When the current through collector 17 reaches twice as much as the current through collector 19 then the current mirror formed by transistors 21 and 22 is satisfied since transistor 22 is twice as large, or can conduct twice as much current, as transistor 21. However, as the current flow in collector 17 increases beyond twice as much as the current flow in collector 19, the voltage at node 24 will increase since transistor 22 will become saturated and its gate voltage remains fixed. Excess current at node 24 will be shunted to voltage terminal 23 by transistor 26. As the voltage at node 24 increases, transistor 26 and transistor 27 will be enabled thereby modifying the output from control circuitry 10 which will react to limit the output current provided by transistors 11 and 12.

As mentioned hereinbefore, in the preferred embodiment, the lateral collectors 17 and 19 are formed, as illustrated in FIG. 2, in a long narrow U configuration 45 with each having its associated emitter in the configuration of a narrow emitter finger 46 positioned inside the U configuration 45. This narrow emitter will have a metal contact 47 at one end thereby avoiding a metal contact over the narrow emitter portion. For Transistor 12, area 47 serves as the emitter area associated with collector 18, while for transistor 11 it also serves as the contact area to the main emitter. Contact to U configured collector 45 is made at its bight portion 48.

The following differential equation was developed for the voltage drop found along the long finger emitter 45 of FIG. 2:

$$d^2V/dX^2 = \rho_s J_s exp(Vq/kT)$$

where V is the voltage applied to the emitter, X is the distance along the emitter, $\rho_s$ is the sheet rho of the emitter finger, $J_s$ is the saturation current density of the long emitter finger, and exp is the well known designation used for exponent.

For a very long emitter finger, the current distribution is given by $$J(X) = \frac{J_o}{\left[\left(\frac{J_o \rho_s \beta}{2}\right)^{\frac{1}{2}} X + 1\right]^2} \quad (1)$$

where J(x) is the current density of the emitter finger at a point X, $J_o$ is the initial current density when X equals 0, and $\beta$ equals the well known quantity $q \div kT$. To obtain the total current, $I_{total}$, emitted by the emitter finger, the above equation is integrated to obtain $$\frac{I_{total}}{W} = \left(\frac{2J_o}{\rho_s \beta}\right)^{\frac{1}{2}} \quad (2)$$

where W is the width of the emitter finger.

Due to the size ratios of transistors 21 and 22 it was determined that it was preferred to have the current in the two lateral collectors 17 and 19 be a ratio of M, or in other words, it was found to be preferrable to have the current densities in the two lateral emitters differ by a factor of M. When X approaches infinity, we have $$I_{12}/W = M(I_{11}/W) \quad (3)$$

where $I_{12}$ is the total current in the emitter finger of transistor 12; W is the width of the emitter finger, and $I_{11}$ is the total current in the emitter finger of transistor 11. By substituting the equation (2) into equation (3) it can be shown that $$J_{12} = M^2 J_{11} \quad (4)$$

However, we must not forget the effects of resistor 13, which are $$RI_{12} = \frac{kT}{q} \ln \frac{J_{11}}{J_{12}} \quad (5)$$

where R is the resistance of resistor 13, $J_{11}$ is the current density of emitter area 47 for transistor 11, and $J_{12}$ is the current density of emitter area 47 for transistor 12. Note that the current in the long emitter finger is being neglected since it is assumed to be much smaller than the current in area 47 and therefore would have a negligible effect on the results of the equation.

This equation (5) can be written as $$R = \frac{kT}{qI_{12}} \ln M^2 \quad (6)$$

However, $$I_{12} = L_{12} \delta_{eff} \frac{J_o}{M^2} \quad (7)$$

where $L_{12}$ is the emitter pad 47 periphery for transistor 12 and $\delta_{eff}$ is the effective emitter width of the emitter pad 47 for transistor 12. So now the value for resistor 13 can be obtained from the equation $$R = \frac{2M^2 kT}{L_{12} \delta_{eff} J_o q} \ln M \quad (8)$$

Note that if the temperature coefficient of the resistor is made equal to that of the quantity on the right the current limit can be made independent of temperature.

FIG. 3 shows in schematic form a simplified control circuitry 10 which can be used as the control circuit of FIG. 1. Line 30 in FIG. 3 represents the line connected to the drain of transistor 27 (FIG. 1). Line 30 is connected to the drain of a P-channel transistor 34 and the drain of an N-channel transistor 31. Transistor 34 forms a current mirror with a P-channel transistor 35 wherein both have their sources connected to voltage terminal 14. Transistor 34 has its gate connected to its drain which is also connected to the gate of transistor 35. Transistor 35 has its drain connected to a node 37. Transistor 31 has its source connected to the source of a transistor 32 and to a current source 33. Transistor 32 has its drain connected to node 37. Transistors 31, 32, 34 and 35 form a differential amplifier. Transistor 32 has its gate electrode connected to a reference circuit which helps establish the output voltage provided by the power supply of FIG. 1. Transistor 31 has its gate electrode connected to a feedback input f.b. The feedback can be derived from a resistive voltage divider network connected from collector 16 to ground terminal 23. Node 37 is connected to the gate electrode of a P-channel transistor 38 which has its drain electrode connected to the drain electrode of an N-channel transistor 39. Transistor 39 has its gate electrode connected to its drain and has its source connected to ground terminal 23. Transistor 38 has its source electrode connected to line 40 which is also connected to a resistor 41. The other end of resistor 41 is connected to voltage terminal 14. Line 40 is coupled to the base electrodes of transistors 11 and 12.

I claim:

1. A circuit for sensing current, comprising: a first transistor having a control electrode, a first current carrying electrode coupled to a first voltage terminal, and a second current carrying electrode, the first transistor also having an additional current carrying electrode capable of carrying a predetermined ratio of current carried by the second current carrying electrode; a second transistor having a control electrode coupled to the control electrode of the first transistor and having a first current carrying electrode and a second current carrying electrode, the second transistor also having an additional current carrying electrode capable of carrying a predetermined ratio of current carried by the second current carrying electrode of the second transistor; a resistor coupled between the first current carrying electrode of the second transistor and the first voltage terminal; a third transistor having a first and a second current carrying electrode and having a control electrode, the first current carrying electrode of the third transistor being coupled to the additional current carrying electrode of the first transistor; and a fourth transistor having a first and a second current carrying electrode and having a control electrode coupled to its first current carrying electrode, the second current carrying electrode of the fourth transistor being coupled to the second current carrying electrode of the third transistor, and the first current carrying electrode of the fourth transistor being coupled to the additional current carrying electrode of the second transistor, and wherein the third transistor is capable of carrying more current than the fourth transistor.

2. The circuit of claim 1 wherein the additional current carrying electrodes and the second current carrying electrodes of the first and second transistors are collectors.

3. The circuit of claim 2 wherein the additional current carrying electrodes are long lateral collectors.

4. The circuit of claim 1 wherein the third transistor is twice as large as the fourth transistor.

5. A monolithic integrated power supply having a solid state current sensing circuit for providing current limiting to the output of the power supply, comprising: a first and a second transistor each having integral means for sampling a portion of current being carried by the transistor; means coupled to the second transistor for creating an unbalance in the current carried by the first and second transistors so that the sampled current from the second transistor will be less than the current sampled from the first transistor; a current mirror coupled to the means for sampling to provide an output when the unbalanced current between the first and second transistors exceeds a predetermined amount; and control means for controlling the first and second transistors and being coupled thereto, and also being coupled to the output of the current mirror to be responsive to the output of the current mirror so that the control means can limit the output current of the power supply when a predetermined current is exceeded.

6. A current sensing circuit comprising: a first and a second transistor each having integral means for sampling a portion of current being carried by the transistor; means coupled to the second transistor for creating an unbalance in the current carried by the first and second transistors so that the sampled current from the second transistor will be less than the current sampled from the first transistor; and a current mirror coupled to the means for sampling to provide an indication of when an unbalance in current occurs between the first and second transistors.

7. The circuit of claim 6 wherein the first and second transistors are bipolar transistors having multiple electrodes where one of the electrodes serves as a means for sampling.

8. The circuit of claim 7 wherein the current mirror has field effect transistors.

9. The circuit of claim 6 wherein the means for creating is a resistor.

* * * * *